United States Patent [19]

Merzhanov et al.

[11] Patent Number: 5,064,808

[45] Date of Patent: Nov. 12, 1991

[54] METHOD OF MANUFACTURING OXIDE SUPERCONDICTORS USING SELF-PROPAGATING HIGH-TEMPERATURE SYNTHESIS

[75] Inventors: Alexandr G. Merzhanov; Inna P. Borovinskaya; Mikael D. Nersesian; Andrei G. Peresada, all of Moskovskaya, U.S.S.R.

[73] Assignee: Institut Strukturnoi Makrokinetiki an SSSR, Chernogolovka, U.S.S.R.

[21] Appl. No.: 445,740

[22] PCT Filed: May 20, 1988

[86] PCT No.: PCT/SU88/00113

§ 371 Date: Nov. 22, 1989

§ 102(e) Date: Nov. 22, 1989

[87] PCT Pub. No.: WO88/09311

PCT Pub. Date: Dec. 1, 1988

[30] Foreign Application Priority Data

May 26, 1987 [SU]  U.S.S.R. .............................. 4244487

[51] Int. Cl.$^5$ ...................... C01B 13/14; C01F 11/04; C01G 3/02
[52] U.S. Cl. ........................................ 505/1; 423/21.1; 423/23; 423/155; 423/604; 501/123; 501/126; 505/725; 505/737
[58] Field of Search .......................... 501/81, 126, 123; 505/1, 725, 737; 423/21.1, 23, 155, 604

[56] References Cited

U.S. PATENT DOCUMENTS

| | | | |
|---|---|---|---|
| 2,104,609 | 1/1938 | de Leeuw | 501/81 |
| 4,161,512 | 7/1979 | Merzhanov et al. | 423/440 |
| 4,431,448 | 2/1984 | Merzhanov et al. | 419/12 |
| 4,540,475 | 9/1985 | De Angelis | 501/96 |
| 4,623,402 | 11/1986 | Maximov et al. | 420/129 |
| 4,647,405 | 3/1987 | Debely | 501/96 |

OTHER PUBLICATIONS

*New Technology Week*, "Soviets Seek U.S. Markets for Sintering Technology" by Kimberly Dozier 3/19/90, p. 3.

McAndrew "Reaction of Organic Materials with YBu$_2$Cu$_3$O$_x$" *Amer. Vac. Soc. Ser 3*, Nov. 6, 1987, pp. 451–458.

Cava, "Bulk Superconductivity at 91K in Single-Phase . . . YBa$_2$Cu$_3$O$_x$" *Phys. Rev. Lett.* vol. 58(16) Apr. 20, 1987, pp. 1676–1679.

Sun "Superconductivity and Magnetism in the High-Tc Superconductor . . . " *Phys. Rev. Lett.* vol. 58(15) Apr. 13, 1987.

Hirabayashi, "Structure and Superconductivity in . . . YBa$_2$Cu$_3$O$_y$" *Jap. Jnl. Appl. Phys.* vol. 26(4) Apr. 1987 pp. L454–455.

Hor, "Superconductivity above 96K in the Square-Planar . . . " *Phy. Rev. Lett.* vol. 58(18) May 4, 1987, pp. 1891–1894.

Kumakura, "Large Magnetization in YBa$_2$Cu$_3$O$_7$ Prepared . . . " *Jap. Jnl. Appl. Phys. Lett.* vol. 27(2) Feb. 1988, pp. L188-90.

*Primary Examiner*—Paul Lieberman
*Assistant Examiner*—John Boyd
*Attorney, Agent, or Firm*—Ladas & Parry

[57] ABSTRACT

The invention relates to production of superconductors, more particularly, LnM$_2^{II}$M$_3^I$O$_y$ compounds where $y=6-8$; Ln=Y, Sc or lanthanide; $M^{II}$=Ba, Ca or Sr; $M^I$=Cu, Cu+Ag or LnM$_2^{II}$M$^I$O$_{y-x}$F where $x=1-2$. It comprises local initiation of an exothermic reaction in a stoichiometric mixutre of source constituents chosen to provide for production of the afore-mentioned compounds. An exothermic mixture of corresponding constituents includes a non-combustible component and a combustible component comprising at least one metal from the group composed of a rare-earth metal of the periodic system chosen from scandium, yttrium and lanthanide, a metal of group II of the periodic system, a metal of group I of the periodic system or hydride of at least one of said metals.

27 Claims, No Drawings

METHOD OF MANUFACTURING OXIDE SUPERCONDUCTORS USING SELF-PROPAGATING HIGH-TEMPERATURE SYNTHESIS

BACKGROUND OF THE INVENTION

The present invention relates to oxide superconductors containing a rare-earth metal and metals of the first and second groups of the periodic system, and to manufacturing methods therefor.

The quality of superconductors is essentially characterized by: initial ($T_{initial}$), mean ($T_m$) and final ($T_{final}$) temperatures in transition to a superconducting state; a temperature transition range ($\Delta T$); a critical current density; and time stabilizes of said characteristics.

The known $LnBa_2CuO_{6.5-7}$ oxide superconductors, in which Ln is Sc, Y or a metal of the lanthanide series, have $T_{initial}$ from 40 to 95K, $T_{final}$ from 26 to 75K and a fairly wide transition range (up to 50K). As a rule, such superconductors are characterized by low quality, inclusion of source constituents in addition to a superconducting phase with resultant spread in $T_{initial}$, $T_{final}$ and $\Delta T$, and time instability (impaired superconducting characteristics due to the effect of air in storage). Moreover, this withstand only small critical currents.

They are pressed black materials having a particle size of 1 to $30\mu$. Density of the final product varies.

They are produced by heat treatment of the La, Ba and Cu source oxides. The powdered $La_2O_3$:BaO and CuO oxides are normally compacted after vigorous agitation, placed in an electric furnace and heat-treated at 900° to 1100° C. for a fairly long time period.

The prior-art methods of obtaining superconductors have been generally unsatisfactory due to great power consumption, a long and multistage production process, low efficiency and small output of a superconducting phase.

For example, another known superconductor includes a rare-earth metal (yttrium), a first-group metal (copper) and a second-group metal (barium), its composition being $(Y_{0.9}Ba_{0.1})CuO_y$ at $T_{initial}=95K$, $T_{final}=75K$ and $\Delta T=20K$. To obtain the aforesaid superconductor, source powders of $Y_2O_3$:$BaCO_3$ and CuO taken in a proper weight proportion are heat-treated at 1000° C. at the initial stage and then at 1100° C. for several hours (cf. Hidenori Takagi, Shin-Ichi Uchida, Kohji Kishio, Koichi Kitazawa, Kazuo Fueki and Shoji Tanaka: "High-Tc Superconductivity and Diamagnetism of Y—Ba—Cu Oxides", Japanese Journal of Appl. Phys., Vol. 26, No. 4, April, 1987, pp L-320-L-321).

The superconductor obtained in compliance with the above method is a multiphase material with nonuniform distribution of phases in the bulk of the specimen. It is characterized by inclusion of source constituents such as $Y_2O_3$, CuO and $Cu_2O$, in addition to the main superconducting phase. The known superconductor manufacturing method involves a long and multistage production process, another disadvantage thereof being great power consumption.

Another known Y—Ba—Cu—O superconductor has $T_{initial}=90K$ and $T_{final}=77K$. The method of manufacturing said superconductor comprises preparation of a mixture of $Y_2O_3$, $BaCO_3$ and CuO taken in appropriate weight proportions, compaction of said mixture to form a blank, its heat treatment at 900° C. for 6 hours in a rarefied oxygen medium (at $P=2\times10^{-5}$ bar), grinding of the blank, its repeated moulding to obtain a pellet and subsequent heat treatment at 925° C. for 24 hours.

The obtained superconductor is a low-quality material characterized by a heterogeneous phase composition with inclusion of carbon up to 0.1% by mass. Moreover, the afore-mentioned superconductor manufacturing method involves a long (up to 10 h) and multistage production process consuming much power (cf. M. K. Wu, J. R. Ashburn and C. J. Torng: "Superconductivity at 93K in a New Mixed-Phase Y—Ba—Cu—O Compound System at Ambient Pressure", Phys. Rev. Letters, Vol. 58, No. 9, March, 1987, p 908).

Another known superconductor includes barium, copper and such a rare-earth metal as holmium (Ho). Its manufacturing method comprises preparation of a mixture of holmium oxide ($Ho_2O_3$), copper oxide and $BaCO_3$ in two constituent ratios, the atomic ratio of Ho:Ba:Cu being $$0.246:0.336:1 \tag{1}$$

and $$0.316:0.335:1 \tag{2}$$

With each ratio (1) and (2), the constituents are mixed up and heat-treated at 850° C. for 2 h in an air envirionment whereupon the mixtures are formed into specimens measuring $8\times2\times1.5$ mm, said specimens being subsequently sintered at 800° C. for 1 h (cf. Shinobu, Hikami, Seiichi Kagoshima, Susumu Komiyama, Takashi Hirai, Hidetoshi Minami and Taizo Masumi: "High Tc Magnetic Superconductor: Ho—Ba—Cu Oxide", Japanese J. of Appl. Phys., Vol. 26, No. 4, April, 1987, pp L-347-L-348).

The superconductors obtained by the known method are characterized by $$T_{initial}=93K, T_{final}=75K \tag{I}$$

$$T_{initial}=74K, T_{final}=47K \tag{II}$$

Great spread in $\Delta T$ (superconducting transition range) is attributable to a heterogeneous phase composition and the low superconducting phase content of the superconductor. Moreover, the aforesaid manufacturing method entails a long and energy-intensive production process.

Other known superconductors contain Yb, Lu or La as a rare-earch metal, Ba or strontium as a second-group metal and copper as a first-group metal, the composition thereof being $(Ln_{1-x}M_x)_2CuO_{4-\delta}$ where M is Ba or Sr.

The method of manufacturing such a superconductor comprises preparation of a mixture of $Yb_2O_3$, $Lu_2O_3$, $Y_2O_3$ or $La_2O_3$, $BaCO_3$ of $SrCO_3$ and copper oxide. Seven different compounds are prepared. The obtained mixtures are heat-treated at 900° C. until green powder is produced. Thereafter the mixtures are formed into pellets which are subsequently heat-treated at 900° C. for several hours until green colour changes into black (cf. Shoichi Hosoya, Shin-ichi Shamoto, Masashige Onodo and Masatoshi Sato: "High Tc Superconductivity in New Oxide Systems", Japanese Journal of Appl. Phys., Vol. 26, No. 4, April, 1987, pp L-325-L-326).

The obtained superconductors have $T_{initial}$ from 65 to 95K and $T_{final}$ from 26 to 60K, depending on the source composition of the mixture. Such superconductors have been generally unsatisfactory due to low quality, a wide superconducting transition range and a heterogeneous phase composition.

The foregoing superconductor manufacturing method entails a long, energy-intensive and inefficient production process.

Also known in the art are superconductors containing a rare-earth metal (scandium, yttrium or lanthanide), a first-group metal (copper) and a second-group metal (Ba or strontium) of the periodic system, the composition thereof being $LnM_2^{II}Cu_3O_y$ where $M^{II}$ is a second-group metal of the periodic system (Ba or strontium).

The method of manufacturing the aforesaid compound comprises preparation of a mixture of a rare-earth metal oxide, a constituent composed of a second-group metal ($BaCO_3$ or $SrCO_3$) and copper oxide taken in a ratio ensuring production of the end superconductor wherein the atomic ratio is as follows: rare-earth metal:second-group metal:first-group metal:oxygen=1:2:3:y. After mixing and grinding, the source constituents of the mixture are heat-treated at 950° C. in an oxygen-containing medium for 12 h. The obtained black powder is mixed up and ground again. Next, said powder is heat-treated at 950° C. under similar conditions. It is then formed into blanks at $P=150$ kg/cm$^3$, said blanks being subsequently heat-treated at 700° to 900° C. in an oxygen medium for several hours (cf. E. M. Engler, V. Y. Lee, A. I. Nazzal, R. B. Beyers, G. Lim, P. M. Grant, S. S. Parkin, M. L. Ramirez, J. E. Vazquez and R. J. Savoy: "Superconductivity above Liquid Nitrogen Temperature: Preparation and Properties of a Family of Perovskite-Based Superconductors", J. Am. Chem. Soc., 1987, 109, 2848–2849). Disadvantage of the superconductors produced according to the above method are low quality, presence of contaminants such as source constituents and carbon, a wide superconducting transition range, great spread in parameters, and a small yield of a superconducting phase.

Moreover, the foregoing method involves a long, complicated, multistage and power-intensive production process.

This, the analysis of the prior art shows that, at the present time, there are no adequate methods of producing oxide superconductors containing a rare-earth metal, a first-group metal and a second-group metal of the periodic system, which would have stable characteristics, high quality, purity as regards inclusion of source constituents, a high yield of a superconducting phase (at least 70%, as indicated by permeability measurements) and its uniform distribution in the bulk of the specimen, a narrow (up to 1K) superconductivity zone, desired porosity (from 20 to 50%) and a controlled particle size.

The known methods of obtaining superconductors entail a long (up to 30 h) and energy-intensive production process and have low efficiency. Their automation and control present considerable difficulties.

With all the prior-art methods, source constituents of a mixture, that is, rare-earth metal oxide, second-group metal oxides or their carbonates and copper oxide represent compounds characterized by a maximum level of oxidation of the constituent metal. Stated differently, said mixture and its constituents are noncombustible components.

SUMMARY OF THE INVENTION

The object of the present invention is to create an oxide superconductor having properties substantially differing from those of the known high-temperature superconductors.

There is provided therefor an oxide superconductor comprising a rare-earth metal of the periodic system, a metal of group I of the periodic system and a metal of group II of the periodic system, which, according to the invention, is made of an exothermic mixture composed of:

a noncombustible component representing a mixture of:

oxide, halide, nitrate, carbonate or oxalate of a rare-earth metal chosen from the series comprising scandium, yttrium or lanthanides or mixtures thereof;

oxide, peroxide, carbonate, nitrate or halide of a metal of group I of the periodic system, which are used separately or in a mixture;

oxide, peroxide, carbonate, nitrate or halide of a metal of group II of the periodic system, which are used separately or in a mixture;

a combustible component representing at least one metal chosen from the following group:

said rare-earth metal of the period system;

a metal of group I of the periodic system;

a metal of group II of the periodic system and/or hydride of at least one metal chosen from the following group:

said rare-earth metal of the periodic system;

a metal of group II of the periodic system;

and comprises the steps of placing the prepared mixture in an oxygen-containing medium having excess oxygen, initiating local ignition at any point in the mixture and maintaining said excess of oxygen until the reaction is terminated, said exothermic mixture containing by mass:

|  | percent |
| --- | --- |
| combustible component | 6.55–39.46 |
| noncombustible component | 60.54–93.45 | the source constituents being taken in a stoichiometric proportion to obtain a final product in the following atomic ratio: rare-earth metal:metal of group II of the periodic system:metal of group I of the periodic system:oxidant=1:2:3:(6–8).

The oxide superconductor obtained by the proposed method has the following parameters: $T_{initial}=92$ to 100K; $T_{final}=92$ to 95K; $\Delta T=1$ to 2K; and $T_m=90$ to 94K. Its composition may be $LnM_2^{II}M_3^IO_y$ where $y=6.5$ to 7; Ln=Y, Sc or lanthanides; $M^{II}=$Ba, Ca, Sr; $M^I=$Cu; Cu+Ag. The oxide superconductor according to the invention may also have the following composition: $LnM_2^{II}M_3^IO_{y-x}F$ where $y=6$ to 8 and $x=1$ to 2.

For example, the $YBa_2Cu_3O_7$ oxide superconductor in compliance with the present invention has the following characteristics: $T_{initial}=100K$; $T_{final}=94K$; and $\Delta T=1(90-10\%)$. The permeability measurements show that the superconducting phase content is 100%. Said superconductor features time stability and 40% porosity and is homogeneous in the bulk of the specimen. An average particle size is $5\mu$ and the impurity content is $10^{-2}\%$ by mass.

It was actually hard to assume that the source constituents comprises in said exothermic mixture would, as a result of combustion, provide for obtaining a high-quality superconductor. Numerous experiments were needed to investigate the combustion conditions for such mixtures.

The introduction in the source constituents of a combustible component in the amount of 6.55-39.46% by mass permits obtaining a mixture capable of burning after combustion is initiated, which results in simultaneous oxidation of all the constituents during combustion, another feature being rapid thermal homogenization in the bulk of the source mixture. The obtained high-purity homogeneous superconductor is characterized by a high yield of a superconducting phase which is uniformly distributed in the bulk of the final product. The proposed manufacturing process involving combustion is characterized by higher effectiveness and a greater output, another advantage thereof being a power-saving factor.

The combustible component includes at least one metal of the rare-earth metal group of the periodic system comprising scandium, yttrium or lanthanide; a metal of group II of the periodic system; a metal of group I of the periodic system; and/or at least one hydride of said metals in a desired stoichiometric proportion with the noncombustible component to prepare an exothermic mixture for obtaining the $LnM_2^{II}M_3^{I}O_y$ or $LnM_2^{II}M_3^{I}O_{y-x}O_{y-x}F$ compound. The metal of group I of the periodic system is advantageously copper or silver (the former metal is preferable). The metal of group II of the periodic system is, as a rule, calcium, strontium or barium (the use of barium is preferable). The hydrides used advantageously comprise a metal chosen from yttrium, scandium, lanthanides or a metal of group II of the periodic system or a mixture of hydrides of said metals, advantageously hydride of one of the metals of the series comprising yttrium, scandium and lanthanides, preferably a mixture of one of the metals chosen from yttrium, scandium and lanthanides with hydride of said metals.

The combustible component is chosen with due regard for specific production conditions, character of source constituents and quality of the final product.

The noncombustible component for preparing an exothermic mixture is preferably the mixture of:

oxide, halide, nitrate, carbonate or oxalate of a rare-earth metal or a mixture thereof;

the following substances taken separately or in a mixture: oxide, peroxide, carbonate, nitrate, halide of a metal of group I of the periodic system, preferably peroxide and nitrate;

the following substances taken separately or in a mixture: oxide, peroxide, carbonate, nitrate, halide of a metal of group II of the periodic system, advisably peroxide, nitrate and metal fluoride, preferably nitrate and peroxide, desirably peroxide. Halides of rare-earth metals comprise their fluoride, bromide, chloride or a mixture thereof, preferably one of fluorides of rare-earth metals or a fluoride mixture. As a regards other compounds, more specifically, nitrates, carbonates and oxalates, it is of advantage to use nitrate of one of the rare-earth metals or a mixture thereof with nitrate of another metal.

Depending on the composition of a particular superconductor according to the invention, source constituents are chosen to prepare a stoichiometric mixture of the constituents for obtaining the compound with the following atomic ratio: rare-earth metal:metal of group II of the periodic system:metal of group I of the periodic system:oxidant = 1:2:3:(6-8). Said mixture should be combustible. Combustion is initiated by local ignition at any point of the exothermic mixture in an oxygen-containing medium comprising excess oxygen or a mixture of oxygen and 5 to 80% by volume of fluorine, argon, nitrogen or air at atmospheric pressure or at a pressure of 2 to 150 bar (0.2 to 15 MPa).

It is advantageous that the production process should occur at atmospheric pressure. In this case, oxygen and/or other suitable oxidizing agent will get into the reaction zone by filtration through the constituents of the exothermic mixture due to the presence of a differential pressure in the surrounding medium in the reaction zone.

Oxygen-containing gas may be supplied to the combustion zone owing to positive pressure and also by passing it through said mixture in a continuous reactor.

The most suitable techniques for carrying out the present invention involve combustion of an exothermic mixture at atmospheric pressure in the flowing oxygen-containing gas.

The prepared exothermic mixture of the chosen constituents may be ignited from the surface, on the inside and also at two or more points simultaneously. The ignition may be advantageously accomplished by the use of an electric coil, an electric spark, an electric arc or a laser beam. Said electric coil may be used to best advantage.

To control porosity and obtain articles of desired shape, the source exothermic mixture of corresponding constituents may be premoulded into a pipe, plate, ring or cylinder to meet specific requirements. To improve oxidant filtration conditions, an oxidizing medium is provided in the reaction (combustion) zone at a pressure of 2 to 150 bar (0.2 to 15 MPa), said medium containing oxygen or its mixture with 5.0 to 80% by volume of at least one substance required (fluorine, argon, nitrogen or air).

The utilization of an oxygen-containing gas mixture under pressure permits decreasing the flow of oxidizing gas. Furthermore, the use of oxygen mixed with air makes it possible to control the exothermic mixture combustion temperature, more specifically, to decrease said temperature, for example, in production of the $YBa_2Cu_3O_{7.0}$ compound wherein the combustible component is $YH_2$ known for its high power.

An oxygen-fluorine mixture is used for obtaining a desired superconductor, say the $YBa_2Cu_3O_{y-2}F_2$ compound. The use of fluorine in the proposed superconductor improves its quality.

When the power of an exothermic mixture is not high, for example, with such constituents as (% by mass) Y:Sc:BaO:CuO = 7.26:3.67:50.09:38.98, it is necessary to preheat the source mixture to 300° C.

Before ignition, the source constituents are, as a rule, ground to a particle size of 0.01 to 0.1 mm and thoroughly mixed up. Such techniques are advantageous to ensure high quality of the final product and stationary production conditions although the range of particle dimensions may be suitably varied to satisfy specific requirements.

BEST MODE OF CARRYING OUT THE INVENTION

The preferred superconductor is $YBa_2Cu_3O_{6.5-7.0}$.

The method of manufacturing the superconductor according to the invention is accomplished as follows.

At the initial stage, an exothermic mixture is prepared with source constituents taken in a stoichiometric proportion to obtain the $YBa_2Cu_3O_{6.5-7.0}$ compound wherein the noncombustible component may be $BaO_2$ and CuO and the combustible component is yttrium hydride, the ratio of said constituents being (% by mass):

YH$_2$:BaO$_2$:CuO = 13.61:50.68:35.71.

The prepared mixture of said constituents is mixed and ground in a ball mill until a particle size is less than 0.1 mm. Grinding to 0.02 mm is preferable. The obtained powder is placed in a quartz reactor. Thereupon oxygen mixed with air in the amount of 20% by volume is passed through the reactor containing said powder.

A steady flow of oxygen-containing gas is maintained and combustion is initiated in said flow to affect the mixture, the combustion being initiated by one of the following methods: by an electric coil, arc, spark, light or laser beam at any point of said mixture. The constituents comprises in the mixture interact due to heat liberated in the course of the reaction. The process spreads in the bulk of the specimen within 10–15 s at a rate of 0.1 to 0.15 cm/s. The obtained compound is cooled to room temperature by the oxygen flow whereupon it is removed from the reactor.

According to X-ray data the obtained superconductor is the YBa$_2$Cu$_3$O$_{6.95}$ compound having an orthorhombic structure and 50% porosity.

The superconducting phase is uniformly distributed in the bulk of the specimen and amounts to 98%, as indicated by permeability measurements.

The parameters of the obtained superconductor are as follows:

$T_{initial}$ = 100K, $T_m$ = 94K, $\Delta T$ = 1K, $T_{final}$ = 95K.

In the specimen the grain size is about 5μ.

EXAMPLE 1

An exothermic mixture is prepared from a combustible component representing metallic yttrium in the amount of 6.55% by mass and from a noncombustible component containing: yttrium oxide including a rare-earth metal in the amount of 8.32% by mass; barium peroxide including a second-group metal in the amount of 49.94% by mass; and copper oxide including a first-group metal in the amount of 39.19% by mass. The prepared stoichiometric mixture is mixed and ground in a ball mill until a particle size of 0.05 mm is obtained. Thereafter the mixture is placed in a quartz reactor and heated to 600° C. Then a metal coil is used to initiate combustion of the mixture in an oxidizing medium (oxygen with air in the amount of 50% by volume).

The combustion spreads in the bulk of the mixture within 10–15 s. The product is then cooled to room temperature in said oxidizing medium. The process lasts for 30 min, including the combustion and cooling stages. The obtained compound has the following superconductivity characteristics: $T_{initial}$ = 100K, $T_m$ = 94K and $\Delta T_{(90-10\%)}$ = 1. Said compound has 40% porosity and is homogeneous throughout the specimen. The grin size is 5μ and the impurity content (unreacted constituents, carbon, etc.) is 10$^{-2}$% by mass. Permeability measurements show that the superconducting phase content is 85%.

Table 1 contains other examples illustrating the use of the proposed method. It specifies source composition of an exothermic mixture, amount of combustible component and production conditions. Table 2 indicates properties of the obtained superconductor, including its superconductivity characteristics.

TABLE 1

| No | Source constituents and their content in exothermic mixture (% by mass) | | | | | |
|---|---|---|---|---|---|---|
| | Rare-earth metal or its compound | | Metal of group II or its compound | | Metal of group I or its compound | |
| 1 | 2 | | 3 | | 4 | |
| 1 | Y 6.55 | Y$_2$O$_3$ 8.32 | BaO$_2$ 49.94 | | CuO 35.19 | |
| 2 | Y 14.2 | | BaO 48.35 | | CuO 37.63 | |
| 3 | Sc 7.51 | | BaO 56.61 | | Cu$_2$O 35.88 | |
| 4 | Y 7.26 | Sc 3.67 | BaO 50.09 | | CuO 38.98 | |
| 5 | YH$_2$ 13.61 | | BaO$_2$ 50.68 | | CuO 35.71 | |
| 6 | YH$_2$ 6.50 | SmH$_2$ 10.90 | BaO$_2$ 48.46 | | CuO 34.14 | |
| 7 | Y$_2$O$_3$ 19.66 | | BaO$_2$ 28.57 | SrO$_2$ 20.19 | Cu 32.18 | |
| 8 | GD$_2$O$_3$ 19.6 | | Ba(NO$_3$)$_2$ 59.78 | | Cu 20.62 | |
| 9 | Gd$_2$O$_3$ 26.64 | | BaCO$_3$ 51.49 | | Cu 24.87 | |
| 10 | Eu$_2$O$_3$ 24.58 | | BaO$_2$ 47.31 | | Cu 25.74 | AgNO$_3$ 2.37 |
| 11 | HO$_2$(CO$_3$)$_3$ 23.34 | | Ba 25.15 | | Cu(NO$_3$)$_2$ 51.51 | |
| 12 | Ho$_2$O$_3$ 26.75 | | BaH$_2$ 39.46 | | CuO 33.79 | |
| 13 | Er$_2$O$_3$ 27.75 | | BaH$_2$ 36.39 | CaH$_2$ 1.23 | CuO 34.63 | |
| 14 | Y$_2$O$_3$ 8.24 | Lu$_2$O$_3$ 14.52 | BaO$_2$ 49.42 | | Cu 27.82 | |
| 15 | Yb$_2$(C$_2$O$_4$)$_3$ 38.88 | | BaO$_2$ 21.58 | SrO$_2$ 15.25 | Cu 24.29 | |
| 16 | Lu(NO$_3$)$_3$ 40.54 | | BaO$_2$ 38.04 | | Cu 21.42 | |
| 17 | Y$_2$O$_3$ 5.67 | YF$_3$ 14.64 | BaO$_2$ 50.99 | | Cu 28.70 | |

TABLE 1-continued

| | | | | | |
|---|---|---|---|---|---|
| 18 | $Y_2O_3$ | $BaH_2$ | BaO | $CuF_2$ | CuO |
| | 17.11 | 39.21 | 4.34 | 15.52 | 23.82 |

| No 1 | Combustible component, % by mass 5 | Oxygen-containing medium, % by volume 6 | Oxidizing medium pressure, atm. 7 | Preheating temperature, °C. 8 | Remarks 9 |
|---|---|---|---|---|---|
| 1 | 6.55 | oxygen + 50% air | 100 | 600 | |
| 2 | 14.02 | oxygen | 50 | 200 | Premoulding of source mixture |
| 3 | 7.51 | oxygen | 50 | 400 | Same |
| 4 | 10.93 | oxygen | 30 | 300 | |
| 5 | 13.61 | oxygen | 15 | — | Ignition with laser beam |
| 6 | 17.40 | oxygen | 10 | — | |
| 7 | 32.18 | oxygen + 80% argon | 10 | — | Ignition with electric arc |
| 8 | 20.62 | oxygen | 1 | 100 | |
| 9 | 24.87 | oxygen | 1 | — | Ignition with a light beam |
| 10 | 25.74 | oxygen | 1 | — | |
| 11 | 25.15 | oxygen | 1 | — | |
| 12 | 39.46 | oxygen + 50% air | 1 | — | |
| 13 | 37.62 | oxygen + 40% argon | 75 | — | |
| 14 | 27.82 | oxygen | 20 | — | Premoulding of mixture |
| 15 | 24.29 | oxygen | 10 | — | |
| 16 | 21.42 | oxygen | 40 | 100 | |
| 17 | 28.70 | oxygen + 5% fluorine | 1 | — | |
| 18 | | oxygen | 1 | — | |

TABLE 2

| | | Characteristics of superconductor | | | Re- |
|---|---|---|---|---|---|
| No | Phase | $T_{initial}$, K | $T_m$, K | $\Delta T_{(90-10\%)}$ | marks |
| 1 | $YBa_2Cu_3O_y$ | 100 | 94 | 1 | |
| 2 | $YBa_2Cu_3O_y$ | 98 | 94 | 1 | |
| 3 | $ScBa_2Cu_3O_y$ | 95 | 90 | 2 | |
| 4 | $Y_{0.5}Sc_{0.5}Ba_2Cu_3O_y$ | 96 | 93 | 2 | |
| 5 | $YBa_2Cu_3O_y$ | 100 | 94 | 1 | |
| 6 | $Y_{0.5}Sm_{0.5}Ba_2Cu_3O_y$ | 94 | 92 | 2 | |
| 7 | $YBaSrCu_3O_y$ | 94 | 90 | 2 | |
| 8 | $GdBa_2Cu_3O_y$ | 93 | 91 | 2 | |
| 9 | $GdBa_2Cu_3O_y$ | 93 | 90 | 2 | |
| 10 | $EuBa_2Cu_{2.9}Ag_{0.1}O_y$ | 100 | 94 | 1 | |
| 11 | $HoBa_2Cu_3O_y$ | 96 | 92 | 1 | |
| 12 | $HoBa_2Cu_3O_y$ | 96 | 92 | 1 | |
| 13 | $ErBa_{1.8}Ca_{0.2}Cu_3O_y$ | 95 | 93 | 2 | |
| 14 | $Y_{0.5}Lu_{0.5}Ba_2Cu_3O_y$ | 96 | 93 | 2 | |
| 15 | $YbBa_2Cu_3O_y$ | 96 | 92 | 2 | |
| 16 | $LuBa_2Cu_3O_y$ | 92 | 90 | 2 | |
| 17 | $YBa_2Cu_3O_{y-2}F_2$ | 100 | 93 | 1 | |
| 18 | $YBa_2Cu_3O_{y-2}F_2$ | 100 | 94 | 1 | |

INDUSTRIAL APPLICABILITY

The proposed oxide superconductors may find applications in electronic engineering, in production of superconducting solenoids and coatings, high-speed computers and medical equipment, as well as in low-temperature facilities.

We claim:

1. A process for producing a superconducting oxide material, the process comprising:
   providing an exothermic mixture of stoichiometric starting amounts of non-combustible and combustible components, the non-combustible component being a mixture of at least one oxide, halide, nitrate, carbonate or oxalate of at least one rare earth metal selected from the group consisting of scandium, yttrium, and lanthanides; at least one oxide, peroxide, carbonate, nitrate or halide of a metal selected from the group consisting of copper, silver and gold; and at least one oxide, peroxide, carbonate, nitrate or halide of a metal selected from the group consisting of calcium, strontium, barium and radium, and the combustible component being selected from the group consisting of at least one of the rare earth metal; a metal selected from the group consisting of copper, silver and gold; a metal selected from the group consisting of calcium, strontium, barium, and radium; a hydride of the rare earth metal, and a hydride of the metal of the group of calcium, strontium, barium and radium;
   placing the exothermic mixture in an oxygen-containing medium having a stoichiometric excess of an oxidizing agent;
   locally igniting the exothermic mixture at any point thereof for initiating a reaction thereof; and
   maintaining the excess of the oxidizing agent until the reaction is completed, whereby to provide a superconducting oxide material.

2. The process according to claim 1, wherein the ratio between the starting amounts of the combustible and non-combustible components is selected such that the stoichiometric ratio of the rare earth metal: metal of the group consisting of copper, silver and gold: metal of the group consisting of calcium, strontium, barium and radium: oxidizing agent in the superconducting oxide materials is 1:2:3: (6–8).

3. The process according to claim 1, wherein the exothermal mixture has the following proportions of the components in percent by mass:

| | |
|---|---|
| combustible | 6.55 to 39.46 |
| non-combustible | 60.54 to 93.45. |

4. The process according to claim 1, wherein the non-combustible component comprises at least one halide or nitrate of the metals thereof.

5. The process according to claim 1, wherein the non-combustible component comprises the halide and the halide is fluoride.

6. The process according to claim 1, wherein the metal of at least one of the groups consisting of copper, silver and gold is copper, silver or a mixture thereof.

7. The process according to claim 1, wherein the metal of at least one of the groups consisting of calcium, strontium, barium and radium is selected from the group consisting of calcium, strontium and barium.

8. A process according to claim 1, wherein the reaction is carried out at a pressure of from about 0.1 to about 15 MPa.

9. The process according to claim 8, wherein the reaction is carried out at about 0.1 MPa.

10. A process according to claim 7, characterized in that the metal of the group consisting of calcium, strontium, barium and radium is barium.

11. A process according to claim 1, characterized in that the combustible component is a mixture of the rare-earth metal with at least one metal of the group consisting of copper, silver and gold.

12. A process according to claim 1, characterized in that the combustible component is a mixture of the metal of the group consisting of copper, silver and gold and the metal of the group consisting of calcium, strontium, barium and radium.

13. A process according to claim 1, characterized in that the combustible component comprises the hydride of the rare-earth metal and the hydride of the metal of the group consisting of calcium, strontium, barium and radium.

14. A process according to claim 13, characterized in that the combustible component comprises the metal of the group consisting of calcium, strontium, barium and radium.

15. A process according to claim 1, characterized in that the non-combustible component comprises the halide or the nitrate of at least one of the metals thereof.

16. A process according to claim 15, wherein the non-combustible component comprises the halide and the halide is a fluoride, bromide or chloride.

17. A process according to claim 16, characterized in that the halide is fluoride.

18. A process according to claim 17, characterized in that the fluoride is of copper, silver or gold.

19. A process according to claim 1, characterized in that the oxygen-containing medium is oxygen, or a mixture of oxygen (20–95% by volume) with at least one additive of the series: argon, nitrogen, air, fluorine, in an amount of 5 to 80% by volume.

20. A process according to claim 19, characterized in that the oxygen-containing medium is oxygen or a mixture thereof with air, argon or fluorine.

21. A process according to claim 1, characterized in that combustion of the exothermal mixture is conducted under atmospheric pressure.

22. A process according to claim 1, characterized in that combustion of the exothermal mixture is conducted under a pressure of 0.2 to 15 MPa.

23. A process according to claim 1, characterized in that the starting components of the exothermal mixture are preliminarily disintegrated to a particle size of from 0.01 to 0.1 mm.

24. A process according to claim 4, characterized in that thermal mixture of the components prior to initiation of combustion is heated to 100°–600° C.

25. A process according to claim 1, characterized in that the local ignition of the exothermal mixture is effected by means of an electric filament, electric arc, electric spark, or by means of a light or laser beam, or by means of an electron beam, or by means of a high-frequency induction heating.

26. A process according to claim 25, characterized in that the local ignition of the exothermal mixture is effected predominantly by means of an electric filament.

27. A process according to claim 1, characterized in that the exothermal mixture of the components is preliminarily moulded as a predetermined-shape article.

* * * * *